United States Patent [19]
Rusu et al.

[11] Patent Number: 5,598,035
[45] Date of Patent: Jan. 28, 1997

[54] INTEGRATED CIRCUIT PACKAGE WITH EXTERNAL STORAGE CAPACITOR FOR IMPROVED SIGNAL QUALITY FOR SENSITIVE INTEGRATED CIRCUIT ELEMENTS

[75] Inventors: Stefan Rusu, Sunnyvale; Clayton L. Yee, San Francisco; Deviprasad Malladi, Campbell; Alan C. Rogers, Palo Alto, all of Calif.

[73] Assignee: Sun Microsystems, Inc., Mountain View, Calif.

[21] Appl. No.: 639,721

[22] Filed: Apr. 29, 1996

Related U.S. Application Data

[63] Continuation of Ser. No. 294,080, Aug. 22, 1994, abandoned.

[51] Int. Cl.$^6$ .................................................. H01L 23/34
[52] U.S. Cl. .................................... 257/723; 257/724
[58] Field of Search ................................. 257/723, 724, 257/691, 532, 296

[56] References Cited

U.S. PATENT DOCUMENTS

4,551,746  11/1985  Gilbert et al. ......................... 257/691
5,388,028   2/1995  Arbanas ............................... 361/710

*Primary Examiner*—Mahshid Saadat
*Assistant Examiner*—S. V. Clark
*Attorney, Agent, or Firm*—Flehr, Hohbach, Test, Albritton & Herbert

[57] ABSTRACT

A package for an integrated circuit is described. The package houses an integrated circuit with a signal quality sensitive integrated circuit element, such as a voltage controlled oscillator of a phase-locked loop. A package-mounted storage capacitor is positioned on the package body to generate a precision control signal. A signal path is constructed between the package-mounted storage capacitor and the integrated circuit to route the precision control signal to the integrated circuit. The relatively short signal path from the package-mounted storage capacitor to the integrated circuit has reduced parasitic capacitance, inductance, and resistance to maintain the quality of the precision control signal. To improve signal quality, certain portions of the signal path are electrically isolated with a shielding trace.

10 Claims, 7 Drawing Sheets

INTEGRATED CIRCUIT PACKAGE WITH EXTERNAL STORAGE CAPACITOR FOR IMPROVED SIGNAL QUALITY FOR SENSITIVE INTEGRATED CIRCUIT ELEMENTS

This is a continuation, of application Ser. No. 08/294,080 filed Aug. 22, 1994 abandoned.

BRIEF DESCRIPTION OF THE INVENTION

This invention relates generally to the packaging of integrated circuits. More particularly, this invention relates to an integrated circuit package with an external storage capacitor mounted thereon to improve signal quality for sensitive integrated circuit elements.

BACKGROUND OF THE INVENTION

The evolution of integrated circuit technology continues to increase transistor speed. At high switching frequencies, capacitive loading and coupling parasitics significantly degrade the speed and quality of signals in an integrated circuit. These effects are especially pronounced for those signals that are generated external to the integrated circuit. In other words, those signals that must travel from a printed circuit board, through an integrated circuit package, and into the integrated circuit. This path includes the following elements: a package pin of a printed circuit board component, a printed circuit board signal trace, an integrated circuit package pin, one or more vias, a signal trace or power plane, a package bond pad, a bond wire, and an integrated circuit bond pad. Each of these elements contributes some parasitic resistance, capacitance, and inductance to the signal path.

The parasitic resistance, capacitance, and inductance of the signal path can seriously compromise the quality of signals processed by sensitive integrated elements. As a result, the operation of the entire integrated circuit can be compromised.

The significance of this problem is especially appreciated in the context of a phase-locked loop. A phase-locked loop produces a recovered data or clock signal corresponding to an input reference signal. In the context of an integrated circuit, a phase-locked loop is commonly used to produce a recovered system clock signal that is used to govern the operation of the entire integrated circuit.

A phase-locked loop generally includes a phase comparator that is used in conjunction with a charge pump circuit to provide a pulsed error signal indicative of the phase difference between the reference signal and the recovered signal. The charge supplied by the error signal is used to develop a control voltage across a capacitor. A voltage controlled oscillator operates to vary the frequency of the recovered signal in accordance with the control voltage of the capacitor. Thus, it can be appreciated that when the capacitor of a phase-locked loop receives a degraded signal attributable to parasitic resistance, capacitance, and inductance of a signal path, the operation of the system clock can be compromised.

It would be highly desirable to provide a semiconductor package with an on-board storage capacitor for improved signal quality for sensitive integrated circuit elements, such as a voltage controlled oscillator of a phase-locked loop. It would also be highly desirable to exploit mature assembly processes in constructing such a package.

SUMMARY OF THE INVENTION

The invention is a package for an integrated circuit. The package houses an integrated circuit with a signal quality sensitive integrated circuit element, such as a voltage controlled oscillator of a phase-locked loop. A package-mounted storage capacitor is positioned on the package body to generate a precision control signal. A signal path is constructed between the package-mounted storage capacitor and the integrated circuit to route the precision control signal to the integrated circuit. The relatively short signal path from the package-mounted storage capacitor to the integrated circuit has reduced parasitic capacitance, inductance, and resistance to maintain the quality of the precision control signal. To improve signal quality, certain portions of the signal path are electrically isolated with a shielding trace.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
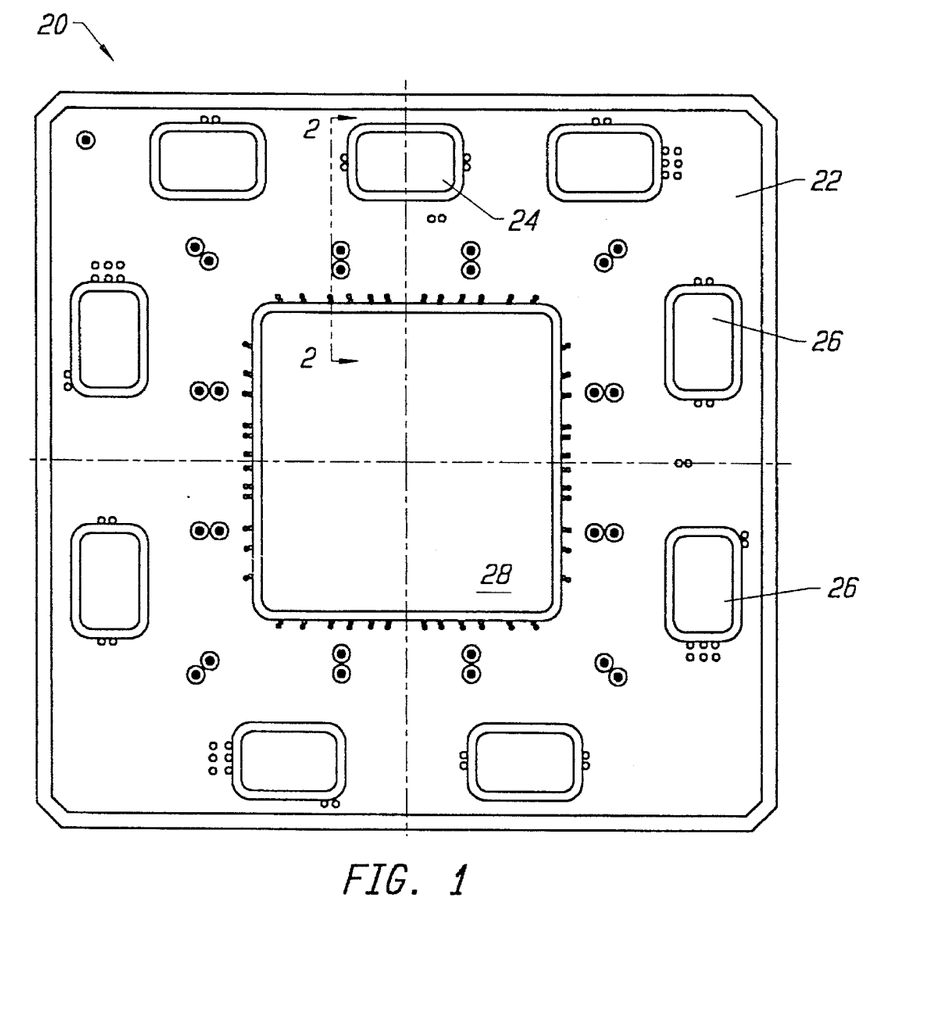
FIG. 1 is a top view of one embodiment of the integrated circuit package of the invention.

FIG. 1 is a top or plan view of one embodiment of an integrated circuit package 20 in accordance with the invention. The package 20 includes a package body 22 which supports a package-mounted storage capacitor 24. The package body 22 also includes a plurality of decoupling capacitors 26. Decoupling capacitors 26 are known in the art. However, as will be described in detail below, the purpose and implementation of the package-mounted storage capacitor 24 of the present invention is dramatically different than that of a decoupling capacitor 26.

FIG. 1 also illustrates a heat sink 28. A semiconductor (not shown in FIG. 1) is attached to the opposite side of the heat sink 28.

Figure 2:
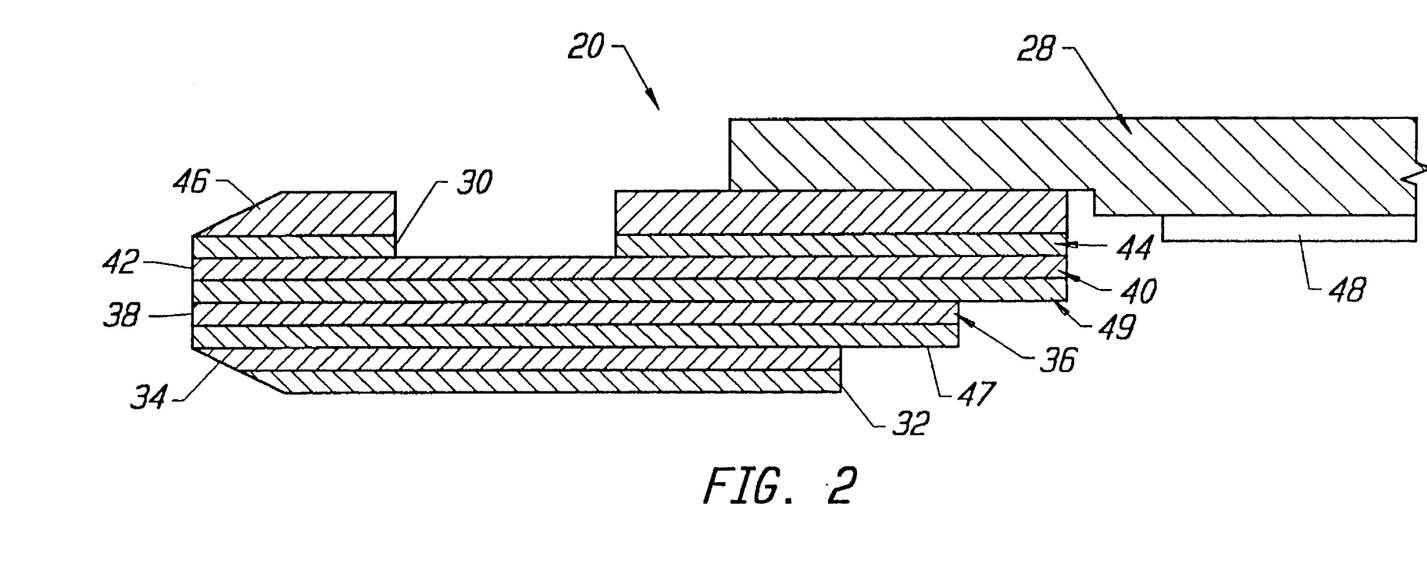
FIG. 2 is a cross-sectional view of one embodiment of the integrated circuit package of the invention taken along the line 2—2 of FIG. 1.

FIG. 2 is a partial cross-sectional view of the integrated circuit package 20 taken along the line 2—2 of FIG. 1. The invention is disclosed in relation to an eight layer, two bond shelf, 313 pin ceramic pin grid array. However, it will be appreciated by those skilled in the art that the techniques associated with the invention are equally applicable to a vast number of package configurations.

The eight metal layer package illustrated in FIG. 2 includes: a pin interconnect layer 32, an output buffer Vcc plane (Vccp) 34, a signal plane 36, an output buffer Vss plane (Vssp) 38, an input buffer Vcc plane (Vcci) 40, an input buffer Vss plane (Vssi) 42, a core logic Vss plane (Vssc) 44, and a core logic Vcc plane (Vccc) 46.

FIG. 2 also illustrates the heat sink 28, which has been implemented in the form of a 800 mm$^2$ copper/tungsten heat slug. An integrated circuit 48 is affixed to the heat sink 28. Bond wires (not shown) are used to electrically couple the integrated circuit 48 to bond pads (not shown) on package bond shelves 47, 49. Finally, FIG. 2 illustrates a package-mounted storage capacitor well 30 that is used to receive the package-mounted storage capacitor 24 of the invention.

Figure 3:
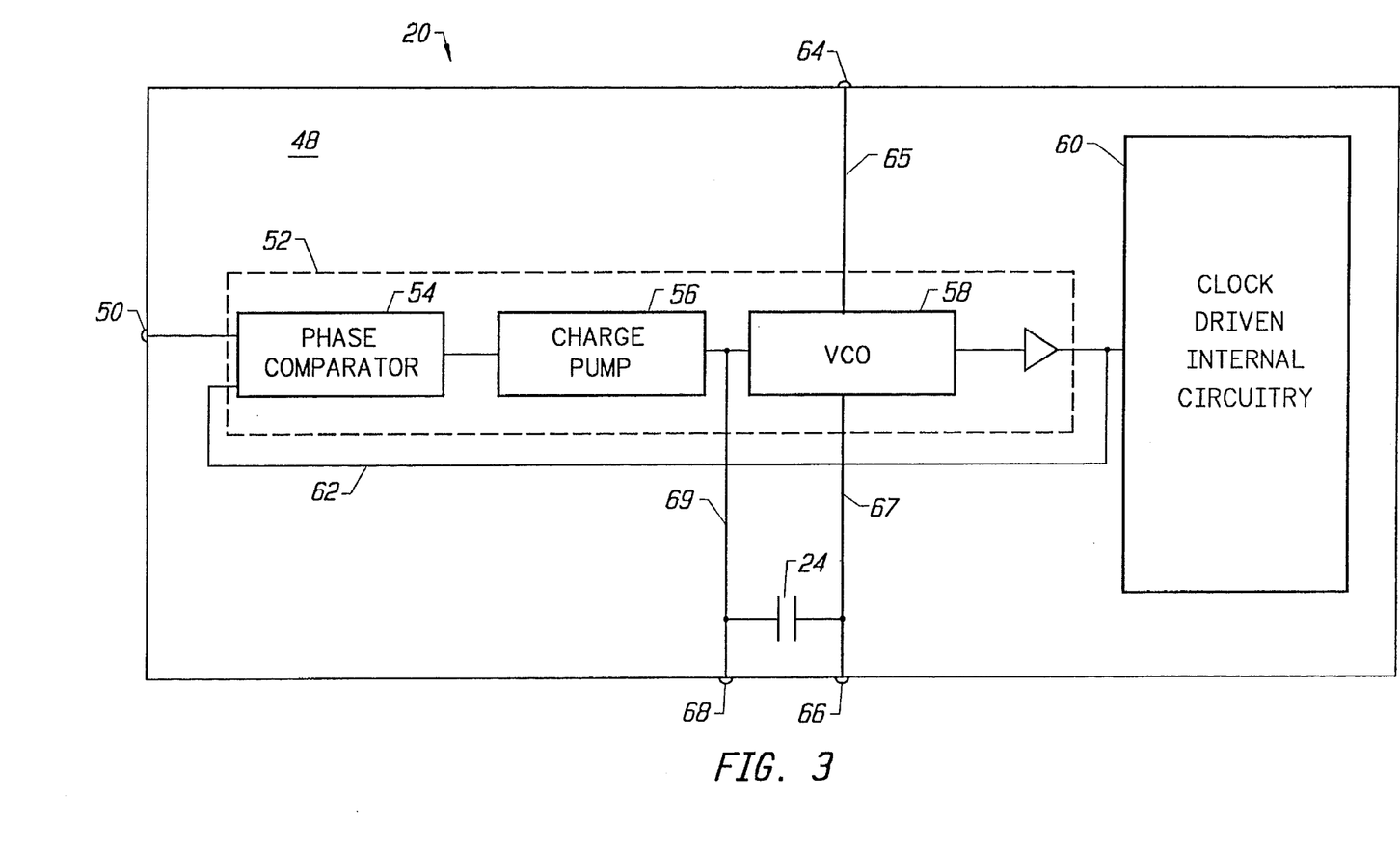
FIG. 3 is a conceptual representation of one embodiment of the package components and electronic components of the invention.

Turning now to FIG. 3, depicted therein is a conceptual schematic of the physical package elements and electronic components of one embodiment of the invention. This embodiment of the invention is disclosed in relation to a phase-locked loop, but, again, it should be appreciated that the package-mounted storage capacitor of the invention may be used in conjunction with any number of sensitive integrated circuit elements (also called signal quality sensitive integrated circuit elements).

FIG. 3 illustrates the integrated circuit package 20 of the invention with its package-mounted storage capacitor 24. The figure also illustrates an external clock pin (Vck) 50. The external clock pin is shown as a package perimeter pin only for the purpose of illustration. The form of the package pin is insignificant. It is only required to provide a pin interface to a printed circuit board, typically of a general purpose computer.

The external clock pin 50 is electrically connected to an integrated circuit 48 of the package 20. The integrated circuit 48 includes a phase-locked loop 52. The phase-locked loop 52 is of the type known in the art. It includes a phase comparator 54, a charge pump 56, and a voltage controlled oscillator (VCO) 58. The output of the VCO 58 is used to control clock-driven internal circuitry 60. A feedback line 62 serves as a second input to the phase comparator 54.

FIG. 3 illustrates that the VCO 58 is connected to a Vcc clock pin (Vccck) 64 by a Vcc clock pin line 65. Similarly, the VCO 58 is connected to a Vss clock pin (Vssck) 66 by a Vss clock pin line 67. A phase-locked loop test pin Vpllrc 68 is electrically connected to the input of the VCO 58 by a capacitor line 69. The package-mounted storage capacitor 24 of the invention is electrically connected between the Vss clock pin line 67 and the capacitor line 69.

In normal operation the Vpllrc pin 68 is left unconnected to external circuitry (it can be connected for testing or debugging purposes). Thus, the voltage on the package-mounted storage capacitor 24 is the sole input on the capacitor line 69. The voltage on the package-mounted storage capacitor 24 constitutes a precision control signal that is processed by the phase-locked loop 52. This improved voltage signal is used by the phase-locked loop 52 in a traditional manner to control the output of the VCO 58. However, in accordance with the invention, the capacitor line 69, also called the package signal path, is relatively short. That is, a relatively short package signal path exists between the package-mounted capacitor 24 and the sensitive integrated circuit element 52. The precise architecture of this signal path is discussed below.

Thus, the present invention is capable of providing a precise and otherwise uncompromised signal to one or more sensitive integrated circuit elements. This stands in contrast to a signal that would be received from an off-package capacitor. Such a signal would be compromised from the significant parasitic resistance, capacitance, and inductance of the signal path.

Figure 4:
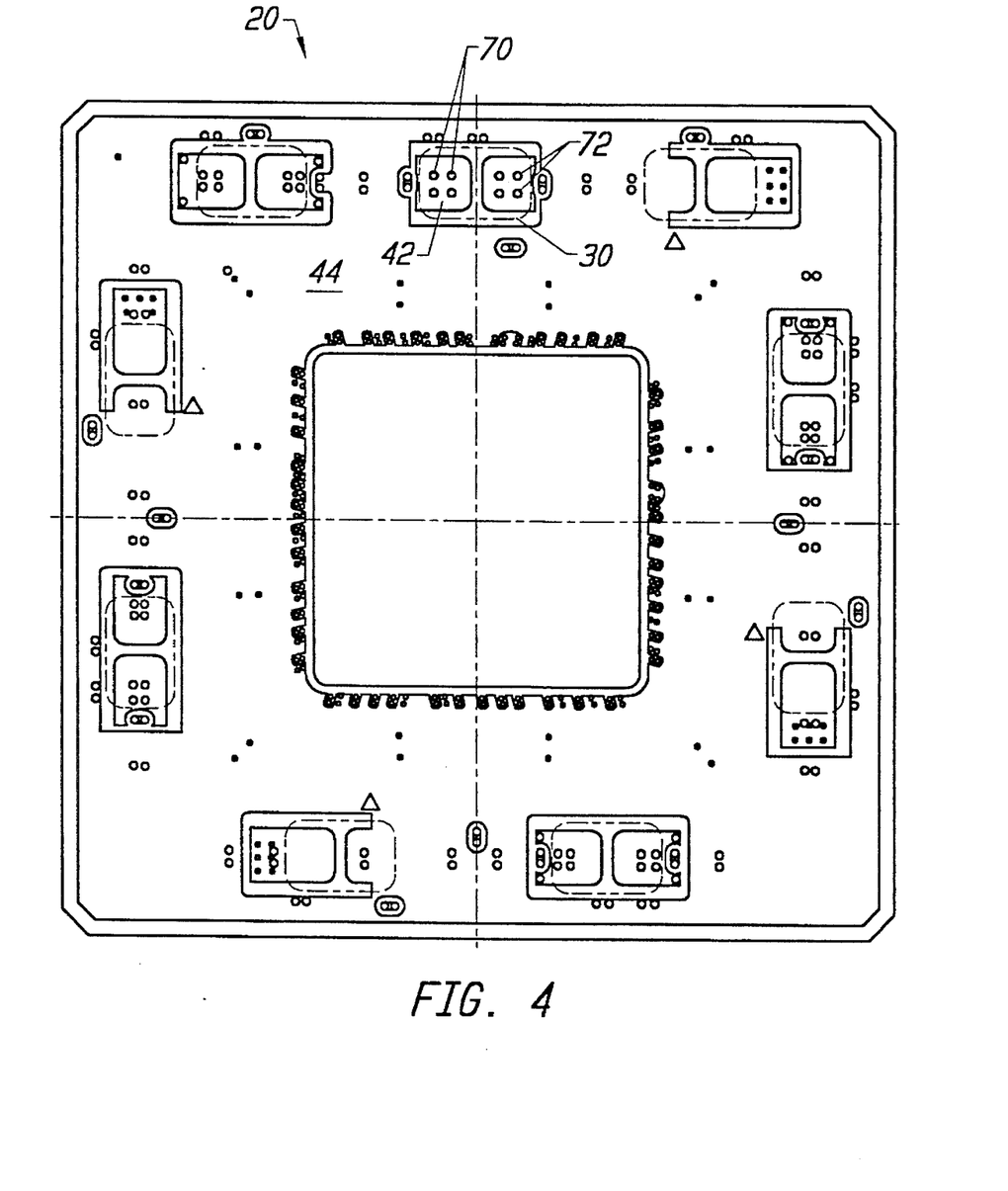
FIG. 4 is a top view of one embodiment of the integrated circuit package of the invention showing a package-mounted storage capacitor well for receiving a package-mounted storage capacitor.

The construction and operation of the apparatus of the invention is more fully appreciated with reference to FIG. 4. FIG. 4 is a top view of the core logic Vss plane 44. As can be seen in FIG. 4 (and FIG. 2), this plane 44 includes a storage capacitor well 30. At the base of the storage capacitor well 30 is the input buffer Vss plane 42. Also at the base of the well is a set of Vssck vias 70 and a set of Vpllrc vias 72.

Figure 5:
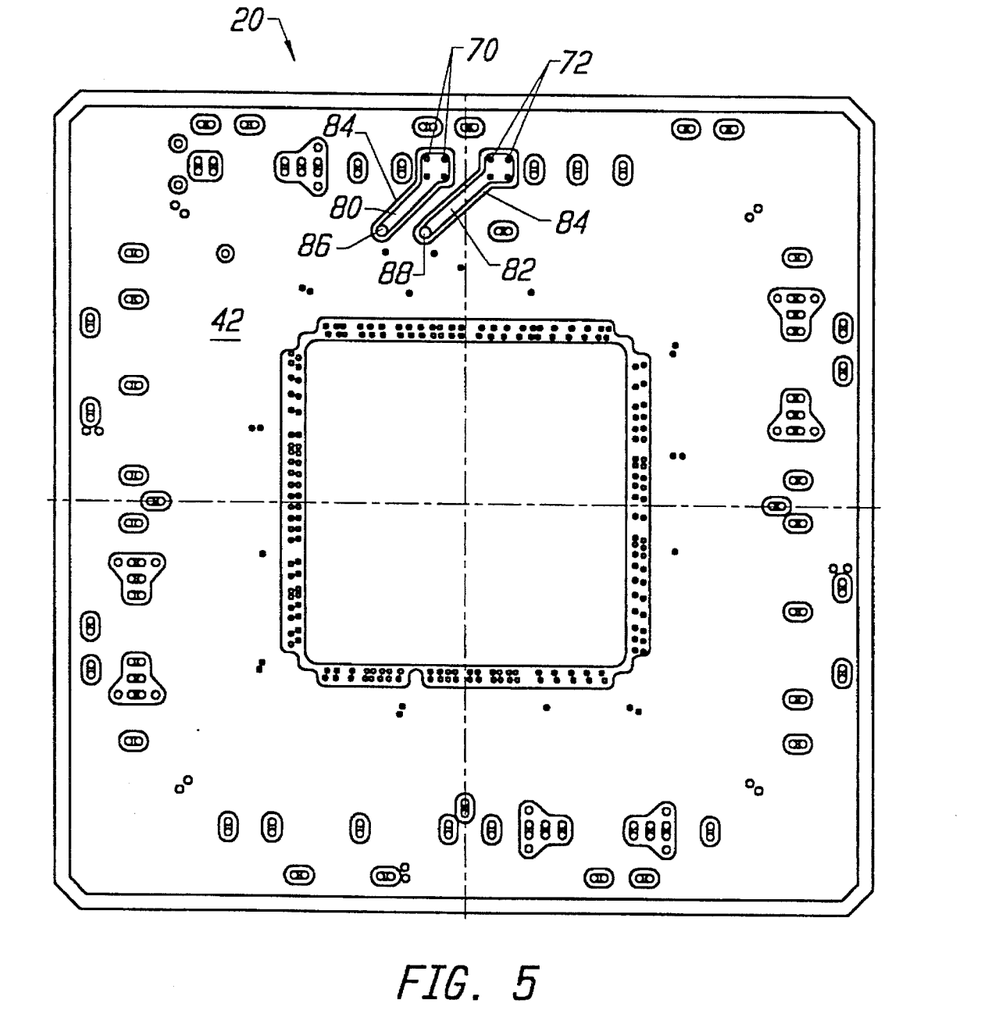
FIG. 5 is a top view of a metal layer including transverse metal regions for routing package-mounted storage capacitor signals associated with one embodiment of the invention.

FIG. 5 illustrates the input buffer Vss plane 42. The figure shows that the Vssck vias 70 of FIG. 4 terminate at a first end of a Vssck transverse metal 80. The second end of the Vssck transverse metal 80 includes a Vssck signal layer via 86. The Vpllrc vias 72 of FIG. 4 terminate at a first end of Vpllrc transverse metal 82. The second end of the Vpllrc transverse metal 82 includes a Vpllrc signal layer via 88. The Vpllrc transverse metal 82 and the Vssck transverse metal 80 are each surrounded by insulating motes 84.

Figure 6:
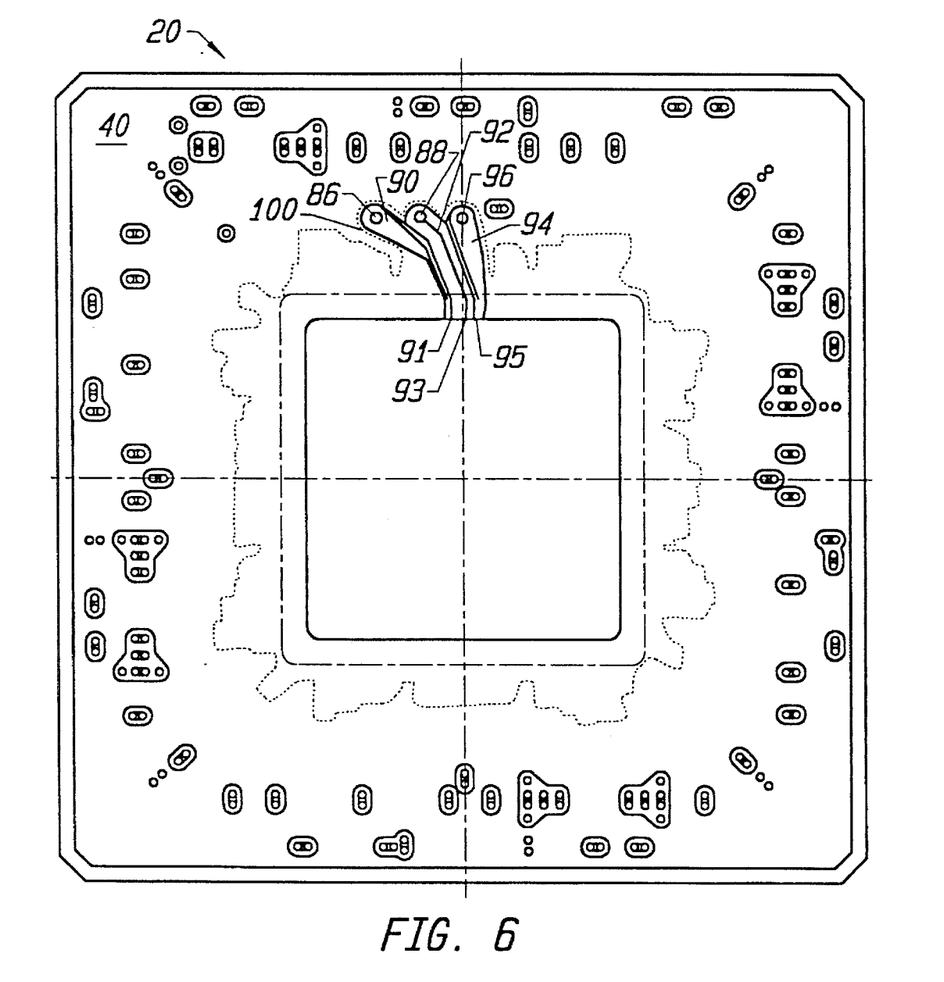
FIG. 6 is a top view of a metal layer including signal traces for routing package-mounted storage capacitor signals associated with one embodiment of the invention.

FIG. 6 illustrates the Vcci input buffer plane 40. The figure shows the Vssck signal layer via 86 terminating in a Vssck trace 90. FIG. 6 also shows the Vpllrc signal layer via 88 terminating in a Vpllrc trace 92. Each trace 90, 92 terminates in a package bond pad 91, 93, respectively.

FIG. 6 also illustrates a Vccck trace 94. This trace is connected to a first end of a Vccck via 96. The second end of the Vccck via 96 is connected to a pin on the pin interconnect layer 32. The Vccck trace 94 terminates on a package bond pad 95.

The Vssck trace 90, the Vpllrc trace 92, and the Vccck trace 96 are isolated from one another by a shielding trace 100. The shielding trace 100 serves to eliminate cross-talk and the effect of transients on the critical signals carried by these traces.

Thus, the present invention provides a short signal path from the package-mounted storage capacitor 24 to the package integrated circuit 48. This path improves signal quality by reducing the parasitic resistance, capacitance, and inductance associated with an analogous prior art signal path. Moreover, the path of the invention is shielded to further enhance signal quality.

Figure 7:
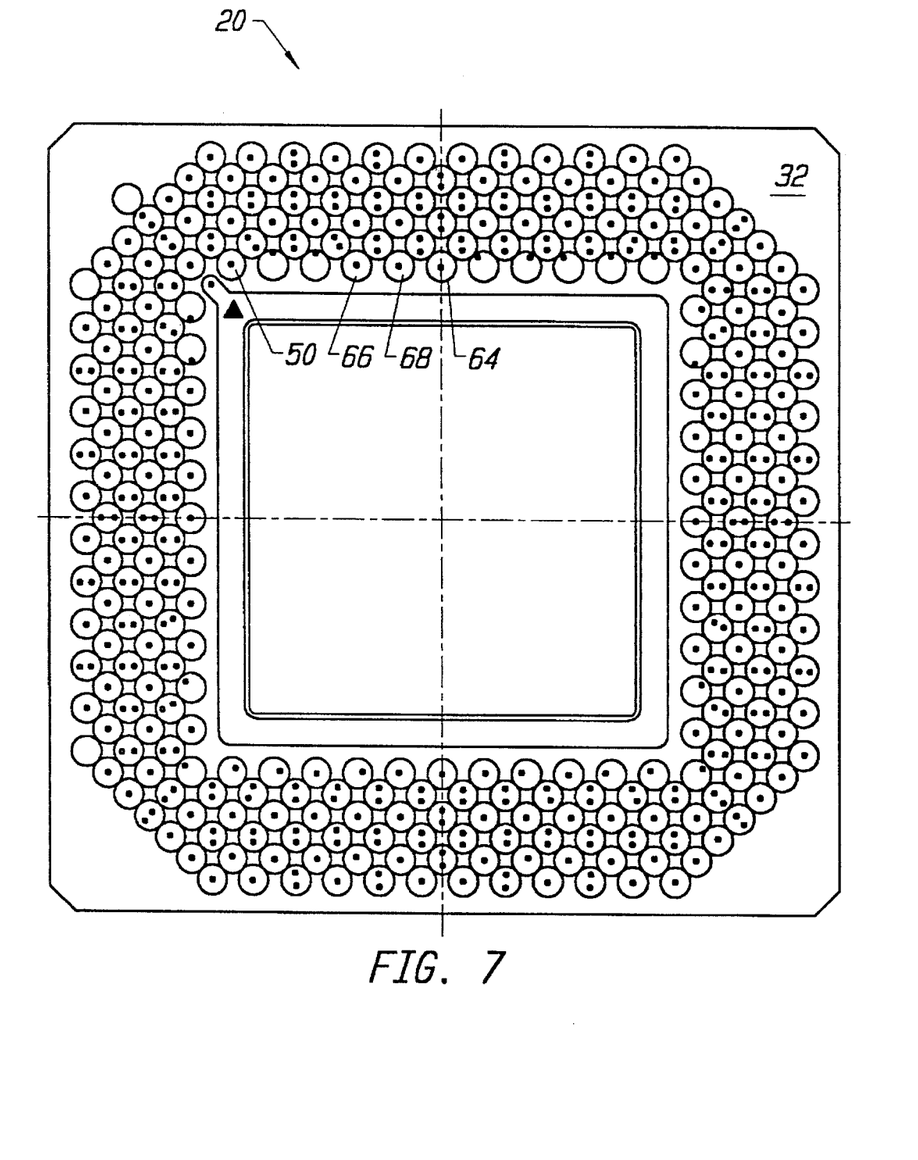
FIG. 7 is a bottom view of the external pins of one embodiment of the integrated circuit package of the invention.

FIG. 7 is a bottom view of the package 20 of the invention. This figure is included to provide complete context for the invention. The figure illustrates the same pins shown in FIG. 3. The exact location of the pins is not critical.

It is advantageous that the present invention is able to exploit mature package assembly techniques developed in relation to decoupling capacitors. That is, decoupling capacitor packaging techniques for positioning a capacitor on a semiconductor package may be exploited in accordance with the present invention. The positioning of a capacitor in accordance with the present invention is analogous to the techniques used for decoupling capacitors. However, the topology of the signal path from the package-mounted storage capacitor 24 to the integrated circuit 48 is distinct from the signal path for a decoupling capacitor.

While there are some similarities between prior art decoupling capacitors and the package-mounted storage capacitor of the invention, it should be appreciated that the purpose and topology of decoupling capacitors is completely distinct from that of the package-mounted storage capacitor 24 of the invention.

Decoupling capacitors were developed to reduce switching noise. When a circuit receives a large current, for example, when large off-chip drivers switch, the surge in current, coupled with parasitic inductances, gives rise to Ldi/dt (inductive) losses. When an off-chip driver switches, the Ld/dt term can become significant. This term can cause a drop in the Vcc voltage and a rise in the Vss ground voltage. This decrease in voltage degrades the circuit's noise margins and also increases signal delay.

Decoupling capacitors are used to rectify this problem. A decoupling capacitor has its two terminals connected to the power and ground planes. The path to the power plane from the decoupling capacitor is much shorter than the path from the off-chip drivers. Thus, the decoupling capacitor provides a low inductance path that can be exploited during switching. That is, the charge on the decoupling capacitor supplements the supply current from the off-chip drivers during switching.

Prior art decoupling capacitors have a distinct purpose and topology. This purpose and topology does not suggest the distinct purpose and topology of the package-mounted storage capacitor of the invention. The purpose of a decoupling capacitor is to deliver power to different power planes. In contrast, the purpose of the present invention is to use a package-mounted storage capacitor to deliver a precision control signal to an integrated circuit component that is sensitive to signal quality. The package-mounted storage capacitor of the invention delivers a continuous precision signal, while decoupling capacitors of the prior art are only active during transient conditions. The signal of the package-mounted storage capacitor is independent of any other signal, while decoupling capacitors provide a supplemental power signal to augment an existing power signal.

The topologies of the two packages are distinct. A decoupling capacitor delivers power to power planes. In contrast, the package-mounted storage capacitor of the invention delivers a signal to a trace. In addition, the package-mounted storage capacitor includes shielded signal paths, a feature that is not applicable to decoupling capacitors. To accommodate the package-mounted storage capacitor of the invention, transverse metal regions (80, 82) are used. This structure is not applicable to decoupling capacitors.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A package for an integrated circuit, comprising:

a package body for housing an integrated circuit including a phase-locked loop and clock driven internal circuitry;

an external clock pin connected to said package body to route an external clock signal to said phase-locked loop;

a package-mounted storage capacitor positioned on said package body to generate a precision control signal; and a signal path between said package-mounted storage capacitor and said phase-locked loop to route said precision control signal from said package-mounted storage capacitor to said phase-locked loop such that said phase-locked loop generates an internal clock signal for said clock driven internal circuitry.

2. The apparatus of claim 1 further comprising a Vcc clock pin connected to said package body to route an external clock signal to said phase-locked loop.

3. The apparatus of claim 1 further comprising a Vss clock pin connected to said package body to route an external clock signal to said phase-locked loop.

4. The apparatus of claim 1 further comprising a phase-locked loop test pin connected to said package body to route a phase-locked loop test signal to said phase-locked loop.

5. The apparatus of claim 1 wherein said package body includes a plurality of stacked metal planes, said package-mounted storage capacitor being electrically connected to a first via in a first metal plane of said plurality of stacked metal planes.

6. The apparatus of claim 5 wherein said first via is connected to a transverse metal region on a second metal plane of said plurality of stacked metal planes.

7. The apparatus of claim 6 wherein said transverse metal region is electrically connected to a signal layer via.

8. The apparatus of claim 7 wherein said signal layer via is connected to a signal trace on a third metal plane of said plurality of stacked metal planes, said signal trace being connected to a bond pad formed within said package body.

9. The apparatus of claim 8 wherein said signal trace is surrounded by a shielding trace to reduce cross-talk and transients on said signal trace.

10. The apparatus of claim 1 further comprising a printed circuit board connected to said package body, said printed circuit board being positioned within a general purpose computer.

\* \* \* \* \*